United States Patent [19]

Salamy

[11] Patent Number: 5,063,138

[45] Date of Patent: Nov. 5, 1991

[54] POSITIVE-WORKING PHOTORESIST PROCESS EMPLOYING A SELECTED MIXTURE OF ETHYL LACTATE AND ETHYL 3-ETHOXY PROPIONATE AS CASTING SOLVENT DURING PHOTORESIST COATING

[75] Inventor: Thomas E. Salamy, North Kingstown, R.I.

[73] Assignee: OCG Microelectronic Materials, Inc., Cheshire, Conn.

[21] Appl. No.: 533,258

[22] Filed: Jun. 4, 1990

Related U.S. Application Data

[62] Division of Ser. No. 269,521, Nov. 10, 1988, Pat. No. 4,965,167.

[51] Int. Cl.$^5$ .................. G03F 7/023; G03F 7/30; G03F 7/32
[52] U.S. Cl. .................... 430/326; 430/169; 430/191; 430/302; 430/309
[58] Field of Search ............. 430/326, 302, 309, 191, 430/169

[56] References Cited

U.S. PATENT DOCUMENTS

| | | | |
|---|---|---|---|
| 4,550,069 | 10/1985 | Pampalone | 430/326 |
| 4,692,398 | 9/1987 | Durham | 430/326 |
| 4,845,008 | 7/1989 | Nishioka et al. | 430/302 |
| 4,871,645 | 10/1989 | Uenishi et al. | 430/326 |
| 4,883,739 | 11/1989 | Sakoguchi et al. | 430/326 |

FOREIGN PATENT DOCUMENTS

| | | | |
|---|---|---|---|
| 211667 | 2/1987 | European Pat. Off. | 430/191 |
| 273026 | 6/1988 | European Pat. Off. | 430/191 |
| 60-24545 | 2/1985 | Japan . | |
| 51-28001 | 3/1986 | Japan . | |

OTHER PUBLICATIONS

Salamy, T. E., et al., "Solvent Effects in Positive Photoresists", Electrochemical Society Meeting, 10/19/89, 12 pp., Hollywood, Fla.

Burggraaf, P., "Positive Photoresists-1988 Trends", Semiconductor International, 4/1988, pp. 128-133.

Ethyl 3-Ethoxy Propionate Material Safety Data Sheet by Kodak Chemical Products Inc.

*Primary Examiner*—Charles L. Bowers, Jr.
*Assistant Examiner*—Janet C. Baxter
*Attorney, Agent, or Firm*—William A. Simons

[57] ABSTRACT

A light-sensitive composition comprising an admixture of:
  (a) at least one alkali-soluble binder resin;
  (b) at least one photoactive compound;
  (c) a sufficient amount of a solvent mixture comprising ehtyl lactate and ethyl 3-ethoxy propionate to dissolve (a) and (b);

wherein the amount of said binder resin is from about 60% to 95% by weight, the amount of said photoactive compound is from about 5% to about 40% by weight, both based on the total solids content of said light-sensitive composition, and wherein the weight ratio of ethyl lactate to ethyl 3-ethoxy propionate is from about 30:70 to 80:20.

10 Claims, No Drawings

POSITIVE-WORKING PHOTORESIST PROCESS EMPLOYING A SELECTED MIXTURE OF ETHYL LACTATE AND ETHYL 3-ETHOXY PROPIONATE AS CASTING SOLVENT DURING PHOTORESIST COATING

This application is a division of application Ser. No. 07/269,521, filed Nov. 10, 1988, now U.S. Pat. No. 4,965,167.

BACKGROUND OF THE INVENTION

1. Field of the Invention

The present invention relates to light-sensitive compositions useful as positive-working photoresist compositions having a selected casting solvent mixture. In particular, the present invention relates to light-sensitive compositions useful as positive-working photoresist compositions having an alkali-soluble binder resin and o-quinonediazide photosensitizers dispersed throughout a casting solvent mixture of ethyl lactate and ethyl 3-ethoxy propionate. Furthermore, the present invention relates to the process of coating, imaging and developing with these positive-working photoresist compositions.

2. Description of Related Art

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to evaporate any casting solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate. In some processes, it is desirable to bake the imaged resist coating before this developing step. This intermediate step is sometimes called post-exposure bake or PEB.

There are two types of photoresist compositions—negative-working and positive-working. Examples of both types of photoresists are well documented in "Introduction to Microlithography", L. F. Thomson, C. G. Willson, and M. J. Bowden, Eds., ACS Symposium Series, 1983.

When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to a developing solution. Thus, treatment of an exposed negative-working resist with a developer solution causes removal of the non-exposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g. a rearrangement reaction occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

Positive-working photoresist compositions are currently favored over negative-working resists because the former generally have better resolution capabilities and pattern transfer characteristics.

In some instances, it is desirable to heat treat the remaining resist layer after the development step and before the following etching step to increase its adhesion to the underlying substrate and its resistance to etching solutions.

After this development operation, the now partially unprotected substrate may be treated with a substrate-etchant solution or plasma gases. This latter technique is called plasma etching or dry etching. The etchant solution or plasma gases etch the portion of the substrate where the photoresist coating was removed during development. The areas of the substrate where the photoresist coating still remains are protected and, thus, an etched pattern is created in the substrate material which corresponds to the photomask used for the image-wise exposure of the radiation.

Later, the remaining areas of the photoresist coating may be removed during a stripping operation, leaving a clean etched substrate surface.

The solvents most commonly used in the formulation of commercial positive photoresists are glycol ethers and glycol ether esters such as 2-methoxyethanol (2-ME), 2-ethoxyethanol (2-EE), and their acetates [ethylene glycol monoethyl ether acetate (EGMEA)]. Some commercial photoresists contain a mixture of glycol ethers or ether acetates with xylene, and n-butyl acetate. Evidence has been disclosed, however, that solvents or solvent mixtures containing these glycol ether derivatives have significant toxic effects on the reproductive organs of both male and female test animals at low exposure levels. While no conclusive data yet exists, similar effects may occur with humans. Suitable solvents which possess all of the desired properties, i.e., solubility, wetting, and low toxicity, are, however, difficult to find. As the Environmental Protection Agency (EPA) concluded in a recent investigation on the use of glycol ethers as solvents, "the electronics industry may have severe problems in obtaining feasible substitutes," (CHEMICAL WEEK, p. 7, June 9, 1986).

In response to this evidence, many photoresist manufacturers have introduced or are working on "EGMEA-free safe solvent" photoresist products. The solvent alternatives include "propylene glycol monomethyl ether acetate (PGMEA), ethyl 3-ethoxy propionate (EEP), ethyl lactate, cyclopentanone N-hexanol and bis(2-methoxyethyl) ether (Diglyme)" (SEMICONDUCTOR INTERNATIONAL April 1988 pages 132 and 133).

While ethyl lactate is an effective safe casting solvent with photoresists containing novolak-type binder resins and o-quinonediazide-type photosensitizers, it has been found that when such ethyl lactate-containing photoresists are spin coated onto a relatively large substrate (e.g. 6 inches or greater silicon wafers), the photoresist film resulting after softbake is found to exhibit a deficiency with regard to coating uniformily. Specifically, there exists a variability in film thickness more than conventional EGMEA based resists. Such resulting uneven cast film may cause unacceptable lithographic properties. Accordingly, there is a need for an improved casting solvent over pure ethyl lactate which does not have this uneven spreading problem.

BRIEF SUMMARY OF THE INVENTION

Accordingly, the present invention is directed to light-sensitive compositions useful as a positive-working photoresist, comprising an admixture of:
 (a) at least one alkali-soluble binder resin, preferably a phenolic novolak resin;
 (b) at least one photoactive compound, preferably a photoactive o-quinonediazide compound; and
 (c) a sufficient amount of a solvent mixture comprising ethyl lactate and ethyl 3-ethoxy propionate to dissolve (a) and (b);
wherein the amount of said binder resin(s) being about 60% to 95% by weight, the amount of said photoactive compound(s) being from about 5% to about 40% by weight based on the total solids content [i.e. excluding the solvent mixture (c)] of said light-sensitive composition, and wherein the weight ratio of ethyl lactate to ethyl 3-ethoxy propionate is from about 30:70 to 80:20.

Still further, the present invention also encompasses the process of coating substrates with these light-sensitive compositions and then imaging and developing these coated substrates.

DETAILED DESCRIPTION

As mentioned above, the photosensitive compositions of the present invention have three critical ingredients; at least one alkali-soluble binder resin; at least one photoactive compound; and the selected solvent mixture mentioned above.

Any or all alkali-soluble binder resins commonly employed in positive-working photoresist compositions may be used herein. The preferred class of binder resins are phenolic novolak resins. Examples of these include phenolic-formaldehyde resins, cresol-formaldehyde resins, and phenol-cresol-formaldehyde resins commonly used in the photoresist art. Polyvinylphenol resins may also be suitable.

Any and all photoactive compounds (sometimes called photosensitizers) which make light-sensitive mixtures useful in positive-working photoresists may be employed herein.

The preferred class of photoactive compounds is o-quinonediazide compounds, particularly esters derived from polyhydric phenols, alkyl-polyhydroxyphenones, aryl-polyhydroxyphenones, and the like which can contain up to six or more sites for esterification. The most preferred o-quinonediazide esters are derived from 2-diazo-1,2-dihydro-1-oxo-naphthalene-4-sulfonic acid and 2-diazo-1,2-dihydro-1-oxo-naphthalene-5-sulfonic acid.

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of(poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4,dihydroxyphenyl hexyl ketone 1,2-naphthoquinonediazide-4-sulfonic acid esters, 2,4-dihydroxybenzophenone 1,2-naphthoquinonediazide-5-sulfonic acid esters, 2,3,4-trihydroxyphenyl hexyl ketone 1,2-naphthoquinonediazide-4-sulfonic acid esters, 2,3,4-trihydroxybenzophenone 1,2-naphthoquinonediazide-4-sulfonic acid esters, 2,3,4-trihydroxybenzophenone 1,2-naphthoquinonediazide-5-sulfonic acid esters, 2,4,6-trihydroxybenzophenone 1,2-naphthoquinonediazide-4-sulfonic acid esters, 2,4,6-trihydroxybenzophenone 1,2-naphthoquinonediazide-5-sulfonic acid esters, 2,2',4,4'-tetrahydroxybenzophenone 1,2-naphthoquinonediazide-5-sulfonic acid esters, 2,3,4,4'-tetrahydroxybenzophenone 1,2-naphthoquinonediazide-5-sulfonic acid esters, 2,3,4,4'-tetrahydroxybenzophenone 1,2-naphthoquinonediazide-4-sulfonic acid esters, 2,2',3,4',6'-pentahydroxybenzophenone 1,2-naphthoquinonediazide-5-sulfonic acid esters and 2,3,3',4,4',5'-hexahydroxybenzophenone 1,2-naphthoquinonediazide-5-sulfonic acid esters; 1,2-quinonediazidesulfonic acid esters of bis[(poly)hydroxyphenyl]alkanes such as bis(p-hydroxyphenyl)methane 1,2-naphthoquinonediazide-4-sulfonic acid esters, bis(2,4-dihydroxyphenyl)methane 1,2-naphthoquinonediazide-5-sulfonic acid esters, bis(2,3,4-trihydroxyphenyl)methane 1,2-naphthoquinonediazide-5-sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-5-sulfonic acid esters and 2,2-bis(2,3,4-trihydroxyphenyl)propane 1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems", 339-352 (1965), John Wiley & Sons (New York) or in S. DeForest, "Photoresist", 50, (1975), MacGraw-Hill, Inc. (New York). In addition, these materials may be used in combinations of two or more. Further, mixtures of substances formed when less than all esterification sites present on a particular polyhydric phenol, alkyl-polyhydroxyphenone, aryl-polyhydroxyphenone and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta- and hexa-esters of polyhydroxy compounds having at least 2 hydroxyl groups, i.e. about 2 to 6 hydroxyl groups, are most preferred.

Among these most preferred 1,2-naphthoquinone-5-diazide compounds are 2,3,4-trihydroxybenzophenone 1,2-naphthoquinonediazide-5-sulfonic acid esters, 2,3,4,4'-tetrahydroxybenzophenone 1,2-naphthoquinonediazide-5-sulfonic acid esters, and 2,2',4,4'-tetrahydroxybenzophenone 1,2-naphthoquinonediazide-5-sulfonic acid esters. These 1,2-quinonediazide compounds may be used alone or in combination of two or more.

Another preferred class of photoactive o-quinonediazide compounds is prepared by condensing spirobiindane or spirobichroman derivatives with 1,2-naphthoquinone-diazido-5-sulfonyl chloride or 1,2-napothoquione-diazido-4-sulfonyl chloride or a mixture thereof to make compounds of formula (A) shown below:

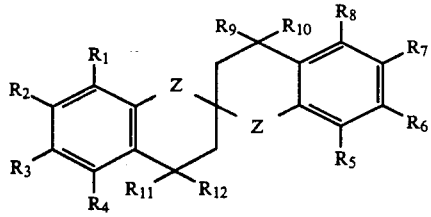

(A)

wherein $R_1$ to $R_8$ are independently hydrogen, a hydroxyl group, a halogen atom, an alkyl group, an alkoxy group, an aralkyl group, an aryl group, an amino group, a monoalkylamino group, a dialkylamino group, an acylamino group, an alkylcarbamoyl group, an arylcarbamoyl group, an alkylsulfamoyl group, an arylsulfamoyl group, a carboxyl group, a cyano group, a nitro group, an acyl group, an alkyloxycarbonyl group, an aryloxycarbonyl group, an acyloxy group,

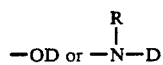

(wherein R is hydrogen, or an alkyl group, and D is a 1,2-naphthoquinonediazido-5-sulfonyl group or a 1,2-naphthoquinonediazido-4-sulfonyl group); $R_9$ to $R_{12}$ are independently hydrogen or a lower alkyl group; and Z is oxygen or a single bond (i.e. the latter forms a five-member ring); provided that at least one of $R_1$ to $R_8$ is

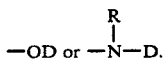

The halogen represented by $R_1$ to $R_8$ in the formula (A) is preferably chlorine, bromine or iodine.

The alkyl group is preferably an alkyl group having 1 to 4 carbon atoms, such as methyl, ethyl, propyl, isopropyl, n-butyl, isobutyl, sec-butyl and tert-butyl.

The alkoxy group is preferably an alkoxy group having 1 to 4 carbon atoms, such as methoxy, ethoxy, hydroxyethoxy, propoxy, hydroxypropoxy, isopropoxy, n-butoxy, isobutoxy, sec-butoxy and tert-butoxy.

The aralkyl group is preferably a benzyl group, a phenethyl group or a benzhydryl group.

The aryl group is preferably phenyl, tolyl, hydroxyphenyl or naphthyl.

The monoalkylamino group is preferably a monoalkylamino group having 1 to 4 carbon atoms, such as monomethylamino, monoethylamino, monopropylamino, monoisopropylamino, mono-n-butylamino, monoisobutylamino, mono-sec-butylamino, or mono-tert-butylamino.

The dialkylamino group is preferably a dialkylamino group with each akyl substituent having 1 to 4 carbon atoms, such as dimethylamino, diethylamino, dipropylamino, di-isopropylamino, di-n-butylamino, di-iso-butylamino, di-sec-butylamino, or di-tert-butylamino.

The acylamino group is preferably an aliphatic group-substituted acylamino group such as acetylamino, propionylamino, butylamino, isobutylamino, isovalerylamino, pivaloylamino or valerylamino, or an aromatic group-substituted acylamino group such as benzoylamino or toluoylamino.

The alkylcarbamoyl group is preferably an alkylcarbamoyl group having 2 to 5 carbon atoms, such as methylcarbamoyl, ethylcarbamoyl, propylcarbamoyl, isopropylcarbamoyl, n-butylcarbamoyl, isobutylcarbamoyl, sec-butylcarbamoyl or tert-butylcarbamoyl.

The arylcarbamoyl group is preferably phenylcarbamoyl or tolylcarbamoyl.

The alkylsulfamoyl group is preferably an alkylsulfamoyl group having 1 to 4 carbon atoms, such as methylsulfamoyl, ethylsulfamoyl, propylsulfamoyl, isopropylsulfamoyl, n-butylsulfamoyl, sec-butylsulfamoyl, or tert-butylsulfamoyl.

The arylsulfamoyl group is preferably phenylsulfamoyl or tolylsulfamoyl.

The acyl group is preferably an aliphatic acyl group having 1 to 5 carbon atoms, such as formyl, acetyl, propionyl, butyryl, isobutyryl, valeryl, isovaleryl or pivaloyl, or an aromatic acyl group, such as benzoyl, toluoyl, salicyloyl or naphthoyl.

The alkyloxycarbonyl group is preferably an alkyloxycarbonyl group having 2 to 5 carbon atoms, such as methoxycarbonyl, ethoxycarbonyl, propoxycarbonyl, isopropoxycarbonyl, n-butoxycarbonyl, isobutoxycarbonyl, sec-butoxycarbonyl or tert-butoxycarbonyl.

The aryloxycarbonyl group is preferably phenoxycarbonyl.

The acyloxy group is preferably an aliphatic acyloxy group having 2 to 5 carbon atoms, such as acetoxy, propionyloxy, butyryloxy, isobutyryloxy, valeryloxy, isovaleryloxy or pivaloyloxy, or an aromatic acyloxy group such as benzoyloxy, toluoyloxy or naphthoyloxy.

The lower alkyl group represented by $R_9$ to $R_{12}$ in the formula (A) is preferably an alkyl group having 1 to 4 carbon atoms, such as methyl, ethyl, propyl, isopropyl, butyl, isobutyl, sec-butyl or tert-butyl.

In the formula (A) above, $R_1$ to $R_8$ are preferably a hydrogen atom, a hydroxy group or an —OD group wherein D is as defined above, and $R_9$ to $R_{12}$ are preferably a hydrogen atom or a methyl group. R is preferably an alkyl group having 1 to 4 carbon atoms, such as a methyl ethyl, n-propyl, iso-propyl, n-butyl, iso-butyl, sec-butyl or t-butyl group.

The proportion of the photoactive compound in the light-sensitive mixture may range from about 5% to about 40%, more preferably from about 10% to about 25% by weight of the non-volatile (e.g. non-solvent) content of the light-sensitive mixture. The proportion of total binder resin of this present invention in the light-sensitive mixture may range from about 60% to about 95%, preferably, from about 75% to 90% by weight, of the non-volatile (e.g. excluding solvents) content of the light-sensitive mixture.

The binder resin and photoactive compound or sensitizer are dissolved in the solvent mixture mentioned above to facilitate their application to the substrate. The preferred amount of solvent may be from about 50% to about 500%, or higher, by weight, more preferably, from about 100% to about 400% by weight, based on combined resin and photoactive compound weight. Preferably, the weight ratio of ethyl lactate to ethyl 3-ethoxy propionate is from about 40:60 to 75:25; more preferably, from about 50:50 to 70:30.

These light-sensitive mixtures may also contain, besides the resin, photoactive compound, and solvent, conventional photoresist composition ingredients such as other resins, actinic and contrast dyes, anti-striation agents, speed enhancers, and the like. These additional ingredients may be added to the binder resin, photoactive compound and solvent mixture solution before the solution is coated onto the substrate.

Actinic dyes help provide improved critical dimension control on highly reflective surfaces by inhibiting back scattering of light off the substrate. This back scattering causes the undesirable effect of optical notching, especially on a substrate topography. Examples of actinic dyes include those that absorb light energy at approximately 400-460 nm [e.g. Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300-340 nm [e.g. 2,5-diphenyloxazole (PPO-Chem. Abs. Reg. No. 92-71-7) and 2-(4-biphenyl)-6-phenyl-benzoxazole (PBBO-Chem. Abs. Reg. No. 17064-47-0)]. The amount of actinic dyes may be up to 10% weight levels, based on the combined weight of resin and photoactive compound.

Contrast dyes enhance the visibility of the developed images and facilitate pattern alignment during manufacturing. Examples of contrast dye additives that may be used together with the light-sensitive mixtures of the present invention include Solvent Red 24 (C.I. No. 26105), Basic Fuchsin (C.I. 42514), Oil Blue N (C.I. No. 61555) and Calco Red A (C.I. No. 26125) up to 10% weight levels, based on the combined weight of resin and photoactive compound.

Anti-striation agents level out the photoresist coating or film to a uniform thickness. Anti-striation agents may be used up to five % weight levels, based on the combined weight of resin and photoactive compound. One suitable class of anti-striation agents is non-ionic silicon-modified polymers. Non-ionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Speed enhancers tend to increase the solubility of the photoresist coating in both the exposed and unexposed areas, and thus, they are used in applications where speed of development is the overriding consideration even though some degree of contrast may be sacrificed, i.e. in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid or nitrocinnamic acid at weight levels of up to 20%, based on the combined weight of resin and sensitizer.

The prepared light-sensitive resist mixture, can be applied to a substrate by any conventional method used in the photoresist art, including dipping, spraying, whirling and spin coating. Spin coating is the most preferred method today. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, doped silicon, aluminum, polymeric resins, silicon dioxide, doped silicon dioxide, silicon resins, gallium arsenide, aluminum gallium arsenide, titanium, tantalum, molybdenum, tungsten, titanium silicides, tantalum silicides, molybdenum silicides, tungsten silicides, silicon nitride, copper, polysilicon, ceramics and aluminum/copper mixtures.

The photoresist coatings produced by the above described procedure are particularly suitable for application to silicon/silicon dioxide-coated or polysilicon or silicon nitride wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins. The photoresist formulations are advantageous over conventional pure-ethyl lactate solvent-containing and other "safe solvents" when applied to relatively large substrates (e.g. silicon wafers having at least a 6 inch diameter).

After the resist solution is coated onto the substrate, the coated substrate is baked at approximately 70° C. to 125° C. until substantially all the solvent has evaporated and only a uniform light-sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. In some instances, a post-exposure bake (PEB) is used to enhance image quality and resolution.

The exposed resist-coated substrates are next developed in an aqueous alkaline developing solution. If immersion developed, the developer solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetraalkylammonium hydroxides.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In the manufacture of microcircuitry units, the developed substrates may then be treated with a plasma gas etch employing conventional plasma processing parameters (e.g., pressure and gas flow rates) and conventional plasma equipment.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLE 1 AND COMPARISONS 1-6

Components

The specific components used in the following formulations are described herein.

Photoactive Component (PAC) is formed by the reaction of 2,2',3,3'-tetrahydro-3,3,3',3'-tetramethyl-1,1'-spirobi (1H-indene)-5,5',6,6',7,7'-hexol (CAS Registry No. 32737-33-0) with 6-diazo-5,6-dihydro-5-oxo-1-naphthalenesulfonyl chloride as described in a Japanese Patent Application 62-233292 filed Sept. 17, 1987 and the corresponding U.S. Pat. No. 4,883,739, which are both assigned to Fuji Photo Film Co. Ltd.

Novolak resin (binder) is formed by the reaction of 40 grams m-cresol and 60 grams p-cresol with 54 grams of 37% aqueous formalin in the presence of 0.05 grams of oxalic acid as catalyst. Novolak is isolated after heating at 150° C. and removing unreacted monomers and water at reduced pressure.

Various solvents as listed in Table 1 were used in the individual formulations.

Formulations

Example 1 and Comparison Examples 1-5 were made by adding the components listed in Table 1 to a round bottle which was placed on a roller mill to agitate. Agitation was continued until complete solution, as determined by visual inspection, was attained. Resist solutions were passed through a 0.2 micron filter to remove particulates and gels.

Comparison Example 6 was WAYCOAT HPR 204 (available from Olin Hunt Specialty Products Inc.) which has ethyl cellosolve acetate (EGMEA), xylene and butyl acetate as its solvent.

TABLE 1

| | Formulation Composition | | | | | |
|---|---|---|---|---|---|---|
| | Formulation | | | | | |
| Ingredients | E-1 | C-1 | C-2 | C-3 | C-4 | C-5 |
| Photoactive Component | 5.2 | 5.2 | 5.2 | 5.2 | 5.2 | 5.2 |
| Novolak binder | 20.8 | 20.8 | 20.8 | 20.8 | 20.8 | 20.8 |
| Ethyl lactate | 48.1 | 74.0 | 48.1 | 48.1 | 48.1 | 0 |
| Ethyl 3-ethoxy propionate | 25.9 | 0 | 0 | 0 | 0 | 0 |
| Diacetone Alcohol | 0 | 0 | 25.9 | 0 | 0 | 0 |
| Cyclohexanone | 0 | 0 | 0 | 25.9 | 0 | 0 |
| Amyl Acetate | 0 | 0 | 0 | 0 | 25.9 | 0 |
| Ethyl Cellosolve Acetate (EGMEA) | 0 | 0 | 0 | 0 | 0 | 74.0 |

Solution Viscosity Testing

The solution viscosity of Example 1 and Comparison Examples 1-6 was determined using a Brookfield LTV Viscometer. The results obtained are summarized in Table 2.

TABLE 2

| Solution Viscosity | |
|---|---|
| Sample | Viscosity (cps) |
| E-1 | 30.9 |
| C-1 | 43.7 |
| C-2 | 50.3 |
| C-3 | 35.6 |
| C-4 | 26.1 |
| C-5 | 24.7 |
| C-6 | 19.0 |

Solution viscosity is an important parameter in obtaining uniform coating on integrated circuit substrates such as silicon wafers.

Evaporation Rate Data

The evaporation rate data relative to butyl acetate (1.00) for the solvent/co-solvent systems employed in formulating Example 1 and Comparative Examples 1-5 are enumerated below in Table 3.

TABLE 3

| Solvent Composition & Evaporation Rate | | |
|---|---|---|
| Example | Solvents(s) Wt. Ratio | Evap. Rate (nBuAc = 1.0) |
| E-1 | ethyl lactate (65) | 0.29 |
| | ethyl 3-ethoxy propionate (35) | 0.12 |
| C-1 | ethyl lactate (100) | 0.29 |
| C-2 | ethyl lactate (65) | 0.29 |
| | diacetone alcohol (35) | 0.12 |
| C-3 | ethyl lactate (65) | 0.29 |
| | cyclohexanone (65) | 0.29 |
| C-4 | ethyl lactate (65) | 0.29 |
| | amyl acetate (35) | 0.40 |
| C-5 | ethyl cellosolve acetate (100) | 0.20 |

The evaporation rate in most cases is directly proportional to solvent release from the cast film. A close inspection of Tables 2 and 3 revealed the ethyl 3-ethoxy propionate is the only co-solvent which, when combined with ethyl lactate, exhibits both properties desirable for good coating uniformity, reduced solution viscosity and lower evaporation rate.

Coating Uniformity Testing

The photoresist samples defined by Example 1 and Comparison Examples 1-6 were coated on 150 mm (6 inch) bare silicon wafers on a Silicon Valley Group (SVG), Inc. Model 8626 Photoresist Coater. A dynamic dispense program was optimized for HPR 204, Comparative Example 6, as control. The optimized HPR 204 coat program was then used to coat the other resist samples (see Table 4). All resists were pump dispensed to eliminate any inconsistency due to hand dispense technique. The coated wafers were softbaked for 50 seconds at 110° C. on the SVG Inc. Model 8636 Hot Plate Oven.

TABLE 4

| Optimized HPR 204 Coating Program | | | | | |
|---|---|---|---|---|---|
| Coat Cycle | | | | | |
| Event | Operation | Arm | Time (sec) | Speed (rpm) | Acc (rpm) |
| 1 | spin | 1 | 3 | 1,000 | 20,000 |
| 2 | dispense | 2 | — | 1,000 | 20,000 |
| 3 | spin | — | 30 | 4,500 | 20,000 |
| 4 | end | — | 0 | 0 | 0 |

| Event | Operation | Time | Step |
|---|---|---|---|
| | Arm 1 | | |
| 1 | traverse | 0 | 000 |
| 2 | end | 0 | 000 |
| | Arm 2 | | |
| 1 | traverse | 3 | 000 |

TABLE 4-continued

| | | | |
|---|---|---|---|
| 2 | home | 0 | 000 |
| 3 | end | 0 | 000 |

A Prometrix Spectramap Model SM200/e film thickness mapping system was used for all film thickness uniformity. Coating uniformity was defined as the range film thickness$_{max}$minus film thickness$_{min}$) determined during forty nine film thickness measurements taken across the diameter of the wafer. Coating uniformity data is summarized for five wafers per example in Table 5.

TABLE 5

Coating Uniformity Data
Softbake Film Thickness (angstroms)

| Example | Mean | Std. Dev. | Range |
|---|---|---|---|
| E-1 | 11,568 | 38 | 137 |
| C-1 | 13,050 | 55 | 184 |
| C-2 | 13,643 | 85 | 320 |
| C-3 | 13,369 | 45 | 157 |
| C-4* | 12,796 | 37 | 137 |
| C-5 | 11,452 | 31 | 114 |
| C-6 | 12,678 | 37 | 125 |

*Coating exhibited severe striations.

The control for the coating uniformity evaluation was C-6, HPR 204. With the exception for the HPR 204 which has a different PAC and binder, the coating range correlated well with the solution viscosity. Coating C-2 with diacetone alcohol as the co-solvent gave the poorest coatings and had the highest solution viscosity (50.3) cps. Coating C-4 had the lowest solution viscosity (26.1 cps) excluding the control, C-6, and was judged, as noted above, not to be suitable due to severe striations in the coated film. Unsuitability was theorized to be caused by the high evaporation rate of the co-solvent, amyl acetate (0.40) causing the film to "set up" too quickly. Coating C-5, with its use of a single solvent, ethyl cellosolve acetate (EGMEA) gave the best coating uniformity. This result was consistent with the lower solution viscosity (24.7 cps) and the lower evaporation rate (0.20). The toxicology profile of EGMEA (documented teratogenicity) was judged to an unattractive feature of this coating system. Coating E-1 was judged to be the best all around system when the toxicology profile of the two solvents, ethyl lactate and ethyl 3-ethoxy propionate, was factored in.

EXAMPLE 2 AND COMPARISON 7

Lithographic Testing

Example 2 was formulated by the same method as described in the preceding formulation section with the following ingredients: photoactive component 5.2 grams, novolak binder 20.8 grams, ethyl lactate 51.8 grams, ethyl 3-ethoxy propionate 22.2 grams. Comparative Example 7 was WAYCOAT FH 6100, a positive working EGMEA based photoresist sold by Fuji Hunt Electronic Technologies, Tokyo, Japan. Both Example 2 and Comparative Example 7 were evaluated lithographically according to the following procedure.

Several 100 mm (4 inch wafers) silicon dioxide (5000 angstrom) wafers that were vapor primed with hexamethyldisilizane prior to coat in a Yield Engineering System LP3 vacuum bake/vapor prime system.

The photoresists were spun on an SVG Coater at about 4500 rpm to produce an approximate 12,500 Angstrom coating thickness. The coated wafers were then softbaked at 110° C. for 60 seconds. The wafers were exposed on a Canon Corp. Model FPA-1550 MII Wafer Stepper equipped with a 0.43 NA lens with sigma=0.50. Coatings were then developed with HPRD-437 Developer (normality=0.250) available from Olin Hunt Specialty Products Inc. in a single spray/puddle that included a 2.5" spray and 40" dwell.

The developed coated wafers were inspected with a Nikon Metashot Microscope as well as an AMRAY Model 1830 SEM. Scanning Electron Photomicrographs at 0.7µ and 1.0µ images were measured with dial calipers. Critical dimension data for 1.0µ is shown in Table 6 and critical dimension data for 0.7µ feature are shown in Table 7.

TABLE 6

Exposure Energy vs. Critical Dimensions (µ)
1.0µ Features

| Exposure Energy | Resist Type | |
|---|---|---|
| (mJ/cm$^2$) | C-7 | E-2 |
| 195 | 1.08 | 1.14 |
| 225 | 1.01 | 1.00 |
| 255 | 0.94 | 0.94 |
| 285 | 0.92 | 0.95 |
| 315 | 0.79 | 0.88 |

TABLE 7

Exposure Energy vs. Critical Dimensions (µ)
0.7µ Features

| Exposure Energy | Resist Type | |
|---|---|---|
| (mJ/cm$^2$) | C-7 | E-2 |
| 195 | 0.72 | 0.73 |
| 225 | 0.65 | 0.62 |
| 255 | 0.60 | 0.56 |
| 285 | 0.59 | 0.56 |
| 315 | 0.39 | 0.48 |

This data is Tables 6 and 7 indicates that the resist of Example 2 can faithfully pattern very small features necessary in state of the art micro-device fabrication comparably with Fuji Hunt 6100 Resist.

What is claimed is:

1. The process of developing an image-wise exposed positive-working photoresist-coated substrate comprising:
   (1) coating said substrate with a light-sensitive composition useful as a photoresist, said composition comprising an admixture of:
      (a) at least one alkali-soluble binder resin;
      (b) at least one photoactive compound;
      (c) a sufficient amount of a solvent mixture comprising ethyl lactate and ethyl 3-ethoxy propionate to dissolve (a) and (b);
      wherein the amount of said binder resin is from about 60% to 95% by weight, the amount of said photoactive compound is from about 5% to about 40% by weight, both based on the total solids contents of said light-sensitive composition, and wherein the weight ratio of ethyl lactate to ethyl 3-ethoxy propionate is from 30:70 to about 80:20, and wherein said substrate is a silicon-containing wafer having a diameter of at least 6 inches;
   (2) subjecting said coating on said substrate to an image-wise exposure of radiant light energy; and
   (3) subjecting said image-wise exposed coated substrate to a developing solution to form a positive image-wise pattern in the coating.

2. The process of claim 1 wherein said binder resin is a phenolic novolak resin.

3. The process of claim 1 wherein said photoactive compound is an o-quinonediazide compound.

4. The process of claim 3 wherein said o-quinonediazide compound or compounds are present in the amount of about 10% to about 25% by weight, said binder resin is present in the amount of about 75% to about 90% by weight, all based on the total solids content of said light-sensitive composition.

5. The process of claim 1 further comprising at least one substance selected from actinic and visual contrast dyes, anti-striation agents and speed enhancers.

6. The process of claim 1 wherein the weight ratio of ethyl lactate to ethyl 3-ethoxy propionate is from about 40:60 to about 75:25.

7. The process of claim 1 wherein the weight ratio of ethyl lactate to ethyl 3-ethoxy propionate is from about 50:50 to about 70:30.

8. The process of claim 1 wherein said silicon-containing substrate is selected from the group consisting of silicon wafers, silicon wafers coated with silicon dioxide, polysilicon wafers, and silicon nitride wafers.

9. The process of claim 1 wherein said developing solution is an aqueous alkaline developing solution.

10. The process of claim 9 wherein said aqueous alkaline developing solution is an aqueous solution of an alkali selected from the group consisting of tetramethylammonium hydroxide, sodium hydroxide, potassium hydroxide, ethanolamine, choline, sodium phosphates, sodium carbonate, sodium metasilicates, and mixtures thereof.

* * * * *